United States Patent
Tani et al.

[11] Patent Number: 5,935,485
[45] Date of Patent: Aug. 10, 1999

[54] PIEZOELECTRIC MATERIAL AND PIEZOELECTRIC ELEMENT

[75] Inventors: Takao Tani, Nagoya; Hiroaki Makino, Owariasahi; Nobuo Kamiya, Nisshin, all of Japan

[73] Assignee: Kabushiki Kaisha Toyota Chuo Kenkyusho, Aichi, Japan

[21] Appl. No.: 08/961,147

[22] Filed: Oct. 30, 1997

[30] Foreign Application Priority Data

| | | | |
|---|---|---|---|
| Oct. 31, 1996 | [JP] | Japan | 8-290762 |
| Feb. 14, 1997 | [JP] | Japan | 9-030867 |
| Mar. 28, 1997 | [JP] | Japan | 9-078365 |
| Apr. 23, 1997 | [JP] | Japan | 9-106233 |

[51] Int. Cl.$^6$ .................................................. H01L 41/00
[52] U.S. Cl. ................... 252/62.9 PZ; 501/134; 428/403; 428/472; 75/229; 75/234; 75/252; 75/247; 75/314; 75/235
[58] Field of Search ................... 428/403, 472; 501/134; 252/62.9 PZ; 75/229, 234, 252, 247, 314, 232, 235

[56] References Cited

FOREIGN PATENT DOCUMENTS 3-223149  10/1991  Japan .
7-232962   9/1995  Japan .

OTHER PUBLICATIONS

Derwent and Chemical Abstract citatations for JP 7–232, 962, Sep. 5, 1995.

*Primary Examiner*—C. Melissa Koslow
*Attorney, Agent, or Firm*—Oblon, Spivak, McClelland, Maier & Neustadt, P. C.

[57] ABSTRACT

A piezoelectric material includes a PZT ceramic, and a noble metal component. The noble metal component is added to the PZT ceramic in an amount of 0.35 parts by volume or more with respect to 100 parts by volume of the PZT ceramic, and is at least one element selected from the group consisting of Ru, Rh, Pd, Os, Ir, Pt and Au, or is an alloy of silver (Ag) and the noble metal element. A piezoelectric element includes a pair of external electrodes, at least a pair of piezoelectric layers, and a conductive layer. The piezoelectric layers are formed of the PZT ceramic, and are disposed between the external electrodes. The conductive layer is formed of the noble metal component, and is insulated from the external electrodes. The piezoelectric layers and the conductive layer are formed lamellarly, and are laminated alternately in a direction connecting the external electrodes.

9 Claims, 6 Drawing Sheets

PIEZOELECTRIC MATERIAL AND PIEZOELECTRIC ELEMENT

BACKGROUND OF THE INVENTION

1. Field of the Invention

The present invention relates to a piezoelectric material. The piezoelectric material includes a lead zirconate titanate (hereinafter referred to as "PZT") ceramic, and a noble metal or a noble metal alloy which is added dispersedly in the PZT ceramic. Moreover, the present invention relates to a piezoelectric element. The piezoelectric element has a laminated structure of a PZT ceramic and a noble metal or a noble metal alloy, instead of a dispersion of a noble metal or a noble metal alloy which is dispersed as particles in the PZT ceramic.

2. Description of the Related Art

There is a piezoelectric material in which a noble metal is added to a PZT ceramic. Japanese Unexamined Patent Publication (KOKAI) No. 3-223,149 discloses one of the piezoelectric materials, a PZT ceramic to which silver (Ag) is added. However, Ag has a low melting point (e.g., 961° C.), and is likely to be oxidized. Accordingly, Ag is solved in the PZT ceramic, or is turned into oxides. As a result, the piezoelectric material disclosed in the publication fails to effect the straining-ability upgrading mechanism which results from the dispersion of the noble metal particles.

Japanese Unexamined Patent Publication (KOKAI) No. 7-232,962 discloses a PZT piezoelectric material in which a powder of palladium (Pd), one of the noble metals, is added in an amount of from 0.02 to 0.4% by weight with respect to a PZT ceramic. Note that 0.4% by weight, the maximum content of the palladium powder, is equal to about 0.27 parts by volume with respect to the PZT ceramic taken as 100 parts by volume. However, in the PZT piezoelectric ceramic disclosed in the publication, the volume content of the palladium powder is extremely small. Consequently, the PZT piezoelectric ceramic can little effect the straining-ability upgrading mechanism which results from the dispersion of the noble metal particles.

Moreover, there is an integrally sintered piezoelectric element. In the integrally sintered piezoelectric element, a plurality of piezoelectric material layers and electrode layers are laminated one after another. Thus, the electrode layers are disposed in the integrally sintered piezoelectric element. As a result, the integrally sintered piezoelectric element can relieve the micro internal strains. However, the internal electrode layers have a heavy thickness of from 1 to 5 $\mu$m, and exhibit an irregularity on the order of a few micrometers. When the internal electrode layers are flexible, they absorb the electric-field-induced strains which the piezoelectric material layers produce under a compressive load. Accordingly, the conventional integrally sintered piezoelectric element cannot exhibit the strain of its own. Moreover, when the irregulaity is present in the internal electrode layers, the irregularity absorbs the strains which result from the extending piezoelectric material layers. In this instance as well, the conventional integrally sintered piezoelectric element cannot effect its own abilities.

SUMMARY OF THE INVENTION

The present invention has been developed in view of the aforementioned circumstances. It is therefore an object of the present invention to make a piezoelectric material which exhibits a large electrically induced strain under a strong electric field.

It is another object of the present invention to furthermore improve the straining ability of the piezoelectric material by optimizing the configuration and state of the dispersed noble metal particles, straining ability which stems from the dispersion of the noble metal particles.

It is still another object of the present invention to provide a piezoelectric material which effects a good straining ability regardless of a reduced addition amount of noble metal element.

It is a further object of the present invention to make a piezoelectric element in which the microscopic internal strains are relieved so that the resultant piezoelectric element can exhibit a superb straining ability.

The inventors of the present invention have studied carefully on the electrically induced strain of lead zirconate titanate (hereinafter referred to as "PZT") ceramics to complete the present invention.

In a first aspect of the present invention, a piezoelectric material comprises:

a PZT ceramic; and a noble metal component added in an amount of 0.35 parts by volume or more to 100 parts by volume of the PZT ceramic, the noble metal component being at least one element selected from the group consisting of ruthenium (Ru), rhodium (Rh), palladium (Pd), osmium (Os), iridium (Ir), platinum (Pt) and gold (Au), or being an alloy of silver (Ag) and the noble metal element.

Further, in the first aspect of the present invention, the noble metal component in the form of powder is dispersed in the PZT ceramic.

Furthermore, in the first aspect of the present invention, the noble metal component in the form of a plate-shaped particle having a pair of planes and a thickness therebetween can be dispersed in grain boundaries of the PZT ceramic.

Moreover, in the first aspect of the present invention, the planes can be oriented perpendicularly with respect to a direction of an electric field to be applied to the piezoelectric material.

In addition, in the first aspect of the present invention, the noble metal component can be deposited on a surface of the PZT ceramic in the form of powder, thereafter being grown to granular form by heating the resulting PZT ceramic with the deposit.

In a second aspect of the present invention, a piezoelectric element comprises:

a pair of external electrodes;

at least a pair of piezoelectric layers, the piezoelectric layers formed of a PZT ceramic disposed between the external electrodes; and a conductive layer formed of a noble metal component being at least one element selected from the group consisting of ruthenium (Ru), rhodium (Rh), palladium (Pd), osmium (Os), iridium (Ir), platinum (Pt) and gold (Ag), or being an alloy of silver (Ag) and the noble metal element, the piezoelectric layers and the conductive layer being disposed alternately in a direction connecting the external electrodes to form a laminated structure, the conductive layer being insulated from the external electrodes.

Further, in the second aspect of the present invention, the conductive layer can have a thickness of 1 $\mu$m or less.

Furthermore, in the second aspect of the present invention, the piezoelectric layers can have a thickness of from 1 to 100 $\mu$m.

In the piezoelectric material according to the first aspect of the present invention, the noble metal component is dispersed in the PZT ceramic, and is formed as an optimum form which maximizes the dispersion effect of the noble metal component. As a result, the present piezoelectric material can effect its own straining ability effectively.

Moreover, the noble metal component can be employed to constitute the piezoelectric element according to the second aspect of the invention. For instance, the noble metal component is formed as particles. The resulting particles of the noble metal component are applied on a surface of a PZT ceramic article as a thin film to form the conductive layer of the present piezoelectric element. Then, a plurality of the resultant PZT ceramic articles provided with the conductive layer are laminated to a predetermined thickness to constitute a component member of the piezoelectric element.

In general, when an electric field is applied to a PZT ceramic, the PZT ceramic generates a strain by an inverse piezoelectric effect and a domain rotation. Accordingly, when an electric field is applied to a PZT ceramic, the directions of the strain development depend on the particles of the PZT ceramic because the particles are usually oriented randomly. Hence, the PZT ceramic cannot generate the strain of its own because the deformations of the PZT ceramic particles are restricted by the surrounding particles. On the contrary, when the particles of the noble metal component are dispersed in the grain boundaries of the PZT ceramic, the restriction on the deformations of the PZT ceramic particles are believed to be partly relieved because the particles of the noble metal component are plastically deformed during the deformations of the PZT ceramic particles. When the restriction on the deformations of the PZT ceramic particles are thus relieved, the PZT ceramic particles can generate a larger strain. Consequently, the PZT ceramic presumably generate an enhanced strain as a whole. As a result, the present piezoelectric material can generate an enlarged electrically induced strain under a strong electric field.

Moreover, when the particles of the noble metal component are formed as a plate shape, the noble metal component can exhibit the dispersion effects much more intensely than nodular or sphere-shaped particles of the noble metal component in relieving the mismatch caused by inconsistent strain of each particle at the grain boundaries, and decrease of an effective electric field to the PZT ceramic particles caused by low dielectric grain boundaries, etc. As a result, the present piezoelectric material including the plate-shaped particles of the noble metal component can exhibit a furthermore enlarged strain.

In addition, the present piezoelectric material can produce the following advantages. The particles of the noble metal component are less likely to form solid solution when a sintering process is carried out to complete the present piezoelectric material, because the particles of the noble metal component can be grown granularly by heating. Accordingly, the noble metal component can be dispersed in the PZT ceramic as particles whose particle diameters are equalized substantially. As a result, the noble metal component can be dispersed in the PZT ceramic in a reduced amount.

Thus, in the present piezoelectric material, the noble metal component is involved in solid solution in a lesser amount, and is dispersed in the PZT ceramic as particles whose particle diameters are equalized substantially. Consequently, the present piezoelectric material can satisfactorily effect a superb straining ability regardless of the reduced addition amount of the noble metal component. In particular, the present piezoelectric material exhibits a piezoelectric constant and strain which are much more superior to those exhibited by the conventional piezoelectric materials.

Further, when the present piezoelectric material is utilized to make a displacement element, such as a piezoelectric actuator, the resultant displacement element can be improved in terms of the displacement characteristic over that of the conventional displacement elements.

Furthermore, the present piezoelectric material can be mass-produced at a sharply reduced material cost because it can be produced by using the raw material of the noble metal component in a reduced amount.

Moreover, the present piezoelectric element can exhibit an enlarged strain because the conductive layer and the piezoelectric layers are laminated so that the conductive layer is disposed dispersedly in the piezoelectric layers. Specifically, the conductive layer relieves the internal strain of the piezoelectric layers, and enables the piezoelectric layers to exhibit a large strain.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Figure 1:
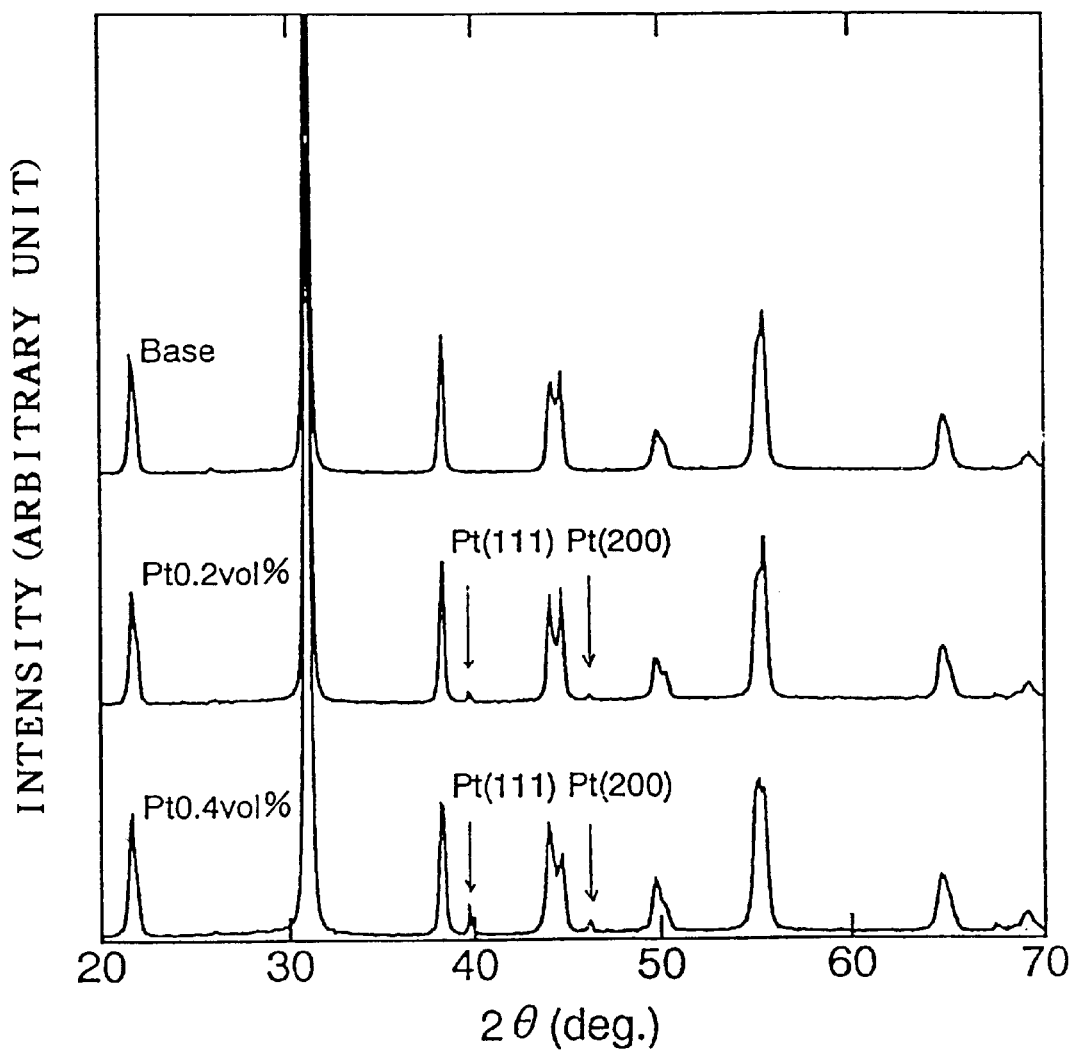
FIG. 1 illustrates X-ray diffraction patterns exhibited by piezoelectric materials whose platinum contents were varied.

Having generly described the present invention, a further understanding can be obtained by reference to the specific preferred embodiments which are provided herein for the purpose of illustration only and not intended to limit the scope of the appended claims.

The present piezoelectric material comprises a PZT ceramic, and a noble metal component added to the PZT ceramic in an amount of at least 0.35 parts by volume or more with respect to the PZT ceramic taken as 100 parts by volume. The addition amount of the noble metal component will be hereinafter expressed as vol. % for short. The noble metal component is at least one member selected from the group consisting of a noble metal element and an alloy. The noble metal element excepts Ag, and is at least one element selected from the group consisting of Ru, Rh, Pd, Os, Ir, Pt and Au. The alloy includes Ag, and the noble metal element.

It is necessary for the present piezoelectric material to include the noble metal component in an amount of 0.35 vol. % or more in order to effect the improved straining ability. When the noble metal component is added to the PZT ceramic in an amount of less than 0.35 vol. %, the dispersion of the noble metal component is resulted less in the improvement in the straining ability of the resulting piezoelectric material. Accordingly, such a reduced addition is unpreferable. On the other hand, when the noble metal component is added to the PZT ceramic in an amount of more than 10 vol. %, the noble metal component may be turned into conductive pass depending on the average particle diameter of the added particles of the noble metal component, and may eventually be resulted in the dielectric breakdown of the PZT ceramic. Consequently, such an increased addition is unpreferable. Thus, it is preferable to add the noble metal component to the PZT ceramic in an amount of from 0.35 to 10 vol. %, further preferably from 0.45 to 10 vol. %.

In particular, when the particles of the noble metal component have an average particle diameter which is substantially equal to that of the particles of the PZT ceramic, the resulting piezoelectric material effects the straining-ability improvement less because there arise the grain boundaries where no particles of the noble metal component are present. The disadvantage stems from the issue associated with the upper limit of the dispersion.

The noble metal component can preferably have a melting point higher than an ordinary sintering temperature (e.g., 1000° C. or more) of the PZT ceramic, and can preferably exhibit good oxidation resistance. The noble metal component element can preferably be at least one element selected from the group consisting of Ru, Rh, Pd, Os, Ir, Pt and Au, or an alloy formed at least two of them. Note that Ag cannot be employed independently in the present invention because it has a melting point lower than the ordinary sintering temperature of the PZT ceramic, because it is likely to be oxidized, and because it cannot remain in the resulting piezoelectric material virtually after sintering. However, when Ag is alloyed with at least one of the aforementioned noble metal elements in order to enhance the heat resistance, it can be used as the noble metal component of the present piezoelectric material. For example, an Ag—Pd alloy can be utilized as the noble metal component, and can be formed as particles and added to the PZT ceramic.

When the noble metal component is formed as a powder and is dispersed uniformly in the grain boundaries of the particles of the PZT ceramic, all of the grain boundaries effect the straining-ability improvement. Accordingly, the resulting present piezoelectric material exhibits a remarkably upgraded straining ability. In view of the advantage, the number of the particles of the powdered noble metal component can preferably be a couple of times as many as the number of the particles of the PZT ceramic. To satisfy this requirement, the particles of the powdered noble metal component can preferably have an average particle diameter which is $1/10$ or less, further preferably from $1/100$ to $1/10$, of an average particle diameter of the PZT ceramic particles. Moreover, the noble metal component, which is to be added to the PZT ceramic, can furthermore preferably be formed as particles.

The PZT ceramic involves lead zirconate titanate as a major component, and can preferably be formed as particles. The configuration and average particle diameter of the particles of the PZT ceramic are not specified in particular, and can be determined arbitrarily. In the present invention, the particles of the PZT ceramic can preferably be formed as a sphere or sphere-like shape, and can preferably have an average particle diameter as small as possible. With these arrangements, the particles of the PZT ceramic exhibit an enlarged specific surface area.

A powder of the PZT ceramic can be prepared in the following manner. First, the raw material powders of the PZT ceramic are mixed in a predetermined mixing amount in a dry manner. The raw material powders can be, for example, a lead oxide, a zirconium oxide, and a titanium oxide. The resulting mixture is calcined by an appropriate thermal treatment. Then, the calcined product is pulverized by a ball mill, or the like, in a wet manner. The resultant slurry is dried and smashed to prepare a desired powder of the PZT ceramic.

In the present invention, the way how to disperse the particles of the noble metal component in the PZT ceramic is not limited specifically. For instance, a powder of the PZT ceramic and a powder of the noble metal component can be mixed in a dry manner or in a wet manner. In this instance, it is preferable to prepare a powder of the noble metal component whose average particle diameter is $1/10$ or less, further preferably from $1/10$ to $1/100$, of an average particle diameter of a powder of the PZT ceramic, because the powder of the noble metal component can hardly be pulverized by simply mixing it with the powder of the PZT ceramic. Moreover, a powder of a raw PZT ceramic and a solution including the ions of the noble metal component can be mixed, and thereafter the resultant mixture can be dried and smashed. As a result, a powder of the PZT ceramic can be prepared on which the adequately fine particles of the noble metal component are loaded. The solution including the ions of the noble metal element can be, for example, platinum chloride and platinum dinitro diamine.

The particles of the noble metal component can be utilized as a member for constituting the later-described present piezoelectric element in the following manner. The particles of the noble metal component are applied on a top surface of a molded article, such as a green sheet, formed of a PZT ceramic. Thus, the particles of the noble metal component are formed as a film-shaped conductive layer for constituting the present piezoelectric element.

Further, the noble metal component can preferably be formed as a powder, and the particles of the powdered noble metal component can preferably dispersed uniformly in the particles of the PZT ceramic powder.

Furthermore, the particles of the noble metal component to be dispersed in the PZT ceramic can preferably be formed as a plate shape, because the particles of the noble metal component having such a shape can effect to sharply improve the straining ability of the resulting present piezoelectric material. When the plate-shaped particles of the noble metal component are dispersed in the particles of the PZT ceramic so that the plate-shaped surface is disposed perpendicularly with respect to a direction of an electric field to be applied to the resultant present piezoelectric material, it is possible to furthermore enhance the straining ability of the present piezoelectric material.

Moreover, the particles of the noble metal component can further preferably be formed as a plate shape. In addition, the plate-shaped particles of the noble metal component can furthermore preferably have a thinner thickness. If such is the case, the plate-shaped particles of the noble metal component can contact with the particles of the PZT ceramic in a large area despite the fact that the plate-shaped particles of the noble metal component can be added in a reduced volumetric ratio with respect to the particles of the PZT ceramic. As a result, the straining -ability improving mechanism is furthermore likely to be effected. In view of this arrangement, the plate-shaped particles of the noble metal component can preferably have a thickness which is $1/10$ or less, further preferably from $1/100$ to $1/20$, of a length of the major plate-shaped surface having a larger surface area. The term, "plate-shaped surface" herein means not only a plate-shaped surface but also an ellipse-shaped surface. The term, "length", herein means a length of one of the sides of major plate-shaped surface, or a major diameter of an ellipse-shaped surface.

When a metallic salt solution of the noble metal component is employed as a raw material form of the noble metal component, it is preferable to granularly grow the deposited particles of the noble metal component by an appropriate thermal treatment. If such is the case, the present piezoelectric material can be furthermore upgraded in terms of the straining ability.

For instance, the deposited particles of the noble metal component can be granularly grown by the following method. When Pt is employed as the noble metal component, a platinum dinitro diamine (i.e., a raw material form of the noble metal component) is used. Accordingly, the platinum elements can be deposited as particles of salt on a surface of the particles of the PZT ceramic. The platinum dinitro diamine exhibits a good solubility to water. Consequently, an aqueous solution of platinum dinitro diamine can be prepared in which the platinum elements are solved homogeneously. By utilizing the aqueous solution, the noble metal component, including the platinum dinitro diamine, can be uniformly deposited as particles on a surface of the particles of the PZT ceramic.

Concerning the way how to mix the particles of the PZT ceramic and the solution including the noble metal component in a wet manner, it is not necessary to specify it explicitly. Any mixing method can be employed arbitrarily. The mixing produces a slurry-like mixture which involves the particles of the PZT ceramic and the solution including the noble metal component The resultant slurry-like mixture is dried to prepare a raw material powder of the PZT ceramic which comprises the particles of the PZT ceramic and the particles of the noble metal component. Likewise, the method of drying the slurry-like mixture is not limited in particular, and can be determined as desired.

In the thus prepared raw material powder of the PZT ceramic, the particles of the noble metal component have particle diameters which are extremely small but are substantially equal to each other, and are dispersed extremely uniformly on a surface of the particles of the PZT ceramic. When the particles of the PZT ceramic are heated under a proper heat-treatment condition, the particles of the noble-metal component can be grown granularly. When the particles of the noble metal component are deposited on a surface of the particles of the PZT ceramic as aforementioned and when they have an average particle diameter of 10 nm or less, the particles of the noble metal elements may react with the particles of the PZT ceramic during calcination. As a result, there arises a fear in that the particles of the noble metal component may be inhibited from exhibiting the dispersion effect. In this instance, it is preferable to carry out a heat treatment in order to granularly grow the particles of the noble metal component.

The heat-treatment condition depends on the types of the noble metal component employed, and determines to what extent the average particle diameter of the particles of the noble metal component is enlarged. In the present invention, the heating temperature is adjusted appropriately so that the particles of the noble metal component can be granularly grown at a desired granular growth rate. Moreover, when the heat-treatment time is controlled according to the granular growth rate, the particles of the noble metal component can be grown granularly to a predetermined average particle diameter.

For example, when Pt is employed as the noble metal component, it is preferable to carry out the heat treatment so that the particles of the noble metal component grow to have an average particle diameter of 100 nm or less, further preferably from 10 to 50 nm. When the particles of the noble metal component (e.g., platinum) grow to have an average particle diameter of 100 nm or more, the straining ability of the resulting piezoelectric material cannot be improved so much. The cause of the disadvantage has not been cleared yet. However, it is believed that the uniform dispersion of the particles of the noble metal component is impaired when the particles of the noble metal component grow to a predetermined average particle diameter or more. In view of the drawback, it is preferable to carry out the heat treatment in a temperature range of from 400 to 600° C., further preferably from 500 to 600° C., so that the particles of the noble metal component grow granularly to have an average particle diameter of 100 nm or less.

The dispersion of the particles of the noble metal component results in the advantage presumably in the following mechanisms. One of the mechanisms is a mechanical mechanism: when an electric field is applied to a PZT ceramic, there arises the mismatch of strain at the grain boundaries because each of the particles of the PZT ceramic is oriented randomly. The mismatch of strain is partly relieved by the elastic or plastic deformation of the particles of the noble metal component. Another one of the mechanism is an electric mechanism: the particles of the noble metal component, the electric conductors, inhibit the grain boundaries of a low permittivity from the decrease of effective electric field to the particles of the PZT ceramic. Although the details of these mechanisms are not apparent at present, the advantage resulting from the dispersion of the particles of the noble metal component is believed to be enhanced anyway when the dispersed particles of the noble metal component contact with the particles of the PZT ceramic in a large area. When the dispersed particles of the noble metal component are formed as a plate shape, they have a larger surface area per a unit volume than they are formed as a sphere shape. As a result, when the plate-shaped particles of the noble metal component and the sphere-shaped particles thereof are added to the particles of the PZT ceramic in an identical volume, the plate-shaped particles of the noble metal component exhibit the dispersion effect more powerfully than the sphere-shaped particles of noble-metal-component. Hence, the present piezoelectric material with the plate-shaped particles of the noble metal component added is believed to show a remarkably improved straining ability.

In particular, when the electric mechanism is taken into consideration predominantly, it is important how the particles of the noble metal component contact with the particles of the PZT ceramic in an electric field to be applied. Therefore, it is further preferable to dispose the plate-shaped particles of the noble metal component so that the plate-shaped surface of a major surface area orients perpendicularly with respect to a direction of an electric field to be applied.

The present piezoelectric element comprises a pair of external electrodes, a pair of piezoelectric layers at least, and a conductive layer. The piezoelectric layers are disposed between the external electrodes, and include a PZT ceramic. The conductive layer is formed on a top surface of the piezoelectric layers, and includes a film-shaped noble metal component. The piezoelectric layers and the conductive layer are formed lamellarly, and are formed alternately in parallel with a pair of the electrodes. The conductive layer is insulated with respect to the external electrodes which are made to apply a predetermined voltage to the present piezoelectric element. The thickness of the conductive layer can preferably be as thin as 1 $\mu$m or less, further preferably from 0.1 to 0.3 $\mu$m. When the thickness of the conductive layer is more than 1 $\mu$m, the conductive layer absorbs the strain of the piezoelectric layers, which is induced by an electric field, so that the resulting piezoelectric element is deteriorated unpreferably in terms of the displacing ability.

In addition, the piezoelectric layers of the present piezoelectric element can preferably have a thickness of from 1 to 100 $\mu$m, furthermore preferably from 1 to 10 $\mu$m so that the present piezoelectric element can securely exhibits the superb displacing ability.

The piezoelectric layers and the conductive layer can be formed in the following fashion. For instance, a green sheet is made from a PZT ceramic. The PZT ceramic constitutes the piezoelectric layer. A layer of the noble metal component is formed on a top surface of the green sheet by means of vapor deposition, or the like. The layer of the noble metal component constitutes the conductive layer. The thus prepared green sheet is cut to a predetermined size. The cut pieces of the green sheet are laminated to a predetermined thickness. The laminated cut pieces are then pressed and sintered to a plate-shaped piezoelectric element precursor. The external electrodes are formed on both of the top and bottom surfaces of the plate-shaped piezoelectric element precursor by means of coating, for instance. The present piezoelectric element can be thus completed.

In the present piezoelectric element, the heterogeneous electric charges, arising in the grain boundaries of the piezoelectric layers, diminish in the conductive layer. Thus, the conductive layer of the present piezoelectric element can relieve the micro internal strains. When the micro internal strains are relieved, the PZT ceramic can effect its own straining ability, which is induced by an electric field. As a result, the present piezoelectric element can be enhanced, for example, in terms of the displacement per a unit actuating voltage.

Note that the conductive layer of the present piezoelectric element is not an electrode to which an external voltage is applied. Hence, the present piezoelectric element distinguishes over the conventional laminated piezoelectric elements.

The present invention will be hereinafter described in detail by reference to the following specific preferred embodiments.

First Preferred Embodiment

Six raw material powders of high purity, for example, a PbO powder, an $La_2O_3$ powder, a $ZrO_2$ powder, a $TiO_2$ powder, an $Nb_2O_5$ powder and an MgO powder, were weighed by predetermined amounts so that the following composition formula was established:

$Pb_{0.97}La_{0.03}[(Mg_{1/3}Nb_{2/3})_{0.06}Zr_{0.47}Ti_{0.44}Nb_{0.03}]O_3$.

The raw material powders were fully mixed in a dry manner. The resulting mixture powder was put in a crucible, and was calcined under the following conditions: in a temperature range of from 700 to 900° C. for 1 to 10 hours. The crucible was formed of MgO. The thus calcined powder was ball-milled for 8 to 72 hours with $ZrO_2$ balls in ethanol. The resultant slurry was dried and smashed to prepare a raw PZT ceramic powder.

A variety of aqueous solutions were added to thus prepared raw PZT ceramic powder, and were mixed therewith in a wet manner. The aqueous solutions included a variety of noble metal powders or noble metal ions in a predetermined amount. A variety of slurries were thus prepared by mixing in a wet manner. The resulting slurries were dried and smashed. Thus, the noble metals (e.g., Pt, Pd and Ag) were loaded on the raw PZT ceramic powder in an amount of 0.1 vol. %, 0.2 vol. %, 0.3 vol. %, 0.35 vol. %, 0.4 vol. % and 0.5 vol. %. Note that the addition amounts of the noble metals (or the addition volumes thereof) were calculated from the density of the raw PZT ceramic which was sintered free of the addition of the noble metal component, and the density of the noble metals.

Each of the thus prepared sample piezoelectric powders was die-pressed at 39.9 MPa. Thereafter, each of the preliminarily-molded substances was cold isostatic pressed at a pressure of 294 MPa to prepare a disk-shaped pellet. Note that the resulting pellets had a diameter of about 15 mm, and a thickness of about 2 mm. Each of the pellets was put in a crucible, and sintered in air under the following conditions: in a temperature range of from 1,000 to 1,300° C. for 2 to 4 hours. The crucible was formed of alumina. Note that the pellets were sintered while they were embedded in pads, which had the same compositions as those of the pellets to be sintered. Each of the thus sintered pellets was then ground on both of the top and bottom surfaces. Thereafter, gold electrodes were applied on both of the top and bottom surfaces of the pellets by an ion coater. Finally, each of the pellets provided with the gold electrodes was polarized in an insulating oil whose temperature was controlled in a range of from 80 to 150° C. Note that the polarization was carried out by applying an electric field whose magnitude was controlled in a range of from 1 to 5 kV/mm to the pellets for 5 to 60 minutes. Each of the piezoelectric ceramic specimens was thus completed.

The electrically induced strains of the thus prepared piezoelectric ceramic specimens were measured by an apparatus for measuring micro displacements. The apparatus was developed at the assignee of the present invention, and could precisely measure micro strains (e.g., 1 $\mu$m or less) in the thickness-wise direction of the pellets (i.e., piezoelectric ceramic specimens) under high compressive stress. The electrically induced strain of the piezoelectric ceramic specimens was measured when an electric field whose magnitude was from −0.4 to +1.2 kV/mm was applied thereto under the following measurement conditions: at normal temperature; in air; and at a compression stress of 20 MPa.

FIG. 1 shows X-ray diffraction patterns of the ground surface of the three piezoelectric ceramic specimens. The first piezoelectric ceramic specimen was free from the noble metal component, and the second and third piezoelectric ceramic specimens included Pt in an amount of 0.2 vol % and 0.4 vol %, respectively. As can be appreciated from FIG.

1, the piezoelectric ceramic specimens with Pt added were observed to exhibit (111) and (200) peaks which resulted from Pt. Moreover, the intensity of the peaks was found to increase in proportion to the addition amount of Pt. Therefore, it was verified that Pt did not solve in the raw PZT ceramic, but was present therein in a form of noble metal.

Figure 2:
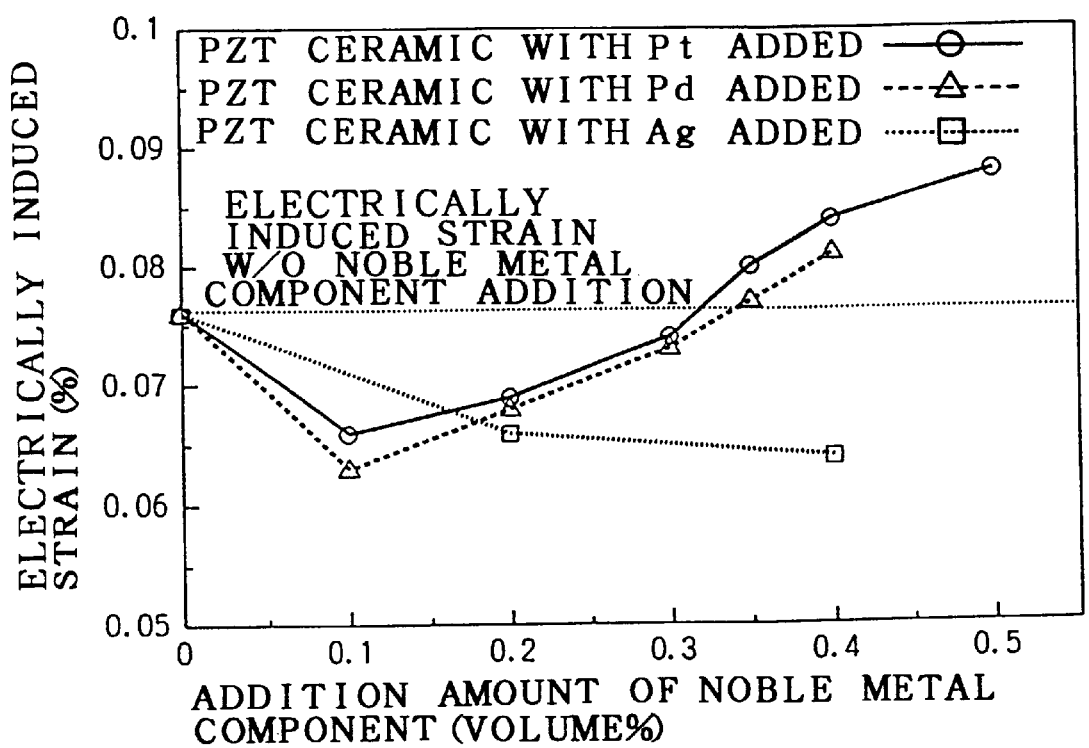
FIG. 2 is a line chart in which the electrically induced strains exhibited by piezoelectric materials of a First Preferred Embodiment according to the present invention are plotted with respect to the addition amounts of the noble metal component therein.

FIG. 2 shows how the electrically induced strains depended on the addition amounts of Pt, Pd and Ag. It is apparent from FIG. 2 that the piezoelectric ceramic specimens with Pt or Pd added exhibited the electrically induced strains which decreased slightly in the area of the small addition amounts of the noble metal components (eg., less than 0.3 vol %) but increased in the area after the addition amount was increased more than 0.3 vol. %. Specifically, when the addition amount of the noble metal components was increased 0.35 vol. %, it is evident that the straining-ability improvement effect of the noble metal components was enhanced remarkably so that the resulting piezoelectric ceramic specimens exhibited strains which were upgraded more than that of the raw PZT ceramic free from the addition of the noble metal components. On the other hand, when the addition amount of the noble metal components was less than 0.35 vol. %, it is understood that the straining-ability improvement effect of the noble metal components was diminished so that the resulting piezoelectric ceramic specimens exhibited strains which were smaller than that of the raw PZT ceramic free from the addition of the noble metal components. Concerning the piezoelectric ceramic specimens with Ag added, even when Ag was added in an amount of 0.35 vol. %, it is apparent that Ag little showed the straining-ability improvement effect, and that the resulting piezoelectric ceramic specimens exhibited strains which were much smaller than that of the raw PZT ceramic free from the addition of the noble metal components.

When discussing the characteristics improvement stemming from the dispersion of particles, it is important to consider the volume occupied by the dispersed particles, not the number of moles thereof or the weight thereof. The raw PZT ceramic had a specific gravity of about 7.5 to 8.0. Pd had a specific gravity of about 12. Therefore, the addition amounts of Pd disclosed in Japanese Unexamined Patent Publication (KOKAI) No. 7-232,962, e.g., 0.4% by weight and 0.5% by weight, equal to about 0.25 to 0.27 vol. % and about 0.31 to 0.33 vol. %, respectively. Thus, the addition amounts of Pd disclosed in the publication fall outside the range of the addition amount of the noble metal component claimed by the present invention.

It is understood from FIG. 1, which illustrates the X-ray diffraction patterns exhibited by the piezoelectric ceramic specimens, that the piezoelectric ceramic specimens with Pt added were improved in terms of the straining ability not because the added Pt elements dissolved in the raw PZT ceramic, but because the added Pt elements were present as particles of metallic Pt in the grain boundaries of the raw PZT ceramic. In view of the fact, it is believed that the other noble metals, their alloys or the Ag alloys can be present as the particles of the noble metal component in the grain boundaries of the raw PZT ceramic, and can effect the improvement of the straining ability of the raw PZT piezoelectric ceramic. The term, "other noble metals", herein means noble metals excepting Ag, for example, Ru, Rh, Pd, Os, Ir, Pt and Au, which are less likely to be oxidized at the ordinary sintering temperature for the PZT ceramic. The term, "Ag alloys" herein means Ag alloys whose heat resistance are enhanced by alloying with the other noble metals.

Second, Third and Fourth Preferred Embodiments

Sphere-shaped or plate-shaped Pt particles were added in an amount of 0.45 vol. % to the same raw PZT ceramic powder as prepared in the First Preferred Embodiment. Each of the resulting mixtures was fully mixed in a dry manner. The addition amounts of the Pt particles (or the addition volumes thereof were calculated in the same way as the First Preferred Embodiment.

The resultant two PZT ceramic powders with the sphere-shaped or plate-shaped Pt particles mixed were die-pressed at 39.9 MPa. Thereafter, the preliminarily-molded substances were cold isostatic pressed at 294 MPa to prepare a disk-shaped pellet, respectively. Note that the pellet had a diameter of about 15 mm, and a thickness of about 2 mm. It is believed that the thus prepared pellets involved the sphere-shaped or plate-shaped Pt particles which were dispersed randomly therein.

Moreover, the PZT ceramic powder with the plate-shaped Pt particles mixed was also subjected to extrusion molding in order to orient the plate-shaped Pt particles. The extrusion molding was carried out in the following fashion: the PZT ceramic powder, a resin binder and water were mixed in a weight ratio of 1:0.2 to 0.5:0.4 to 0.7. The resulting mixture was extruded to a flat plate which had a thickness of about 1 mm. The flat plate was punched out to prepare disk-shaped pellets having a diameter of about 15 mm. The pellets were baked at a temperature of 600° C. for 4 to 8 hours. When the thus prepared pellets were observed, they were discovered to include the plate-shaped Pt particles whose plate-shaped surfaces orient in a planar direction of the pellets. In other words, the plate-shaped surfaces of the plate-shaped Pt particles were oriented perpendicularly with respect to the direction of an electric field to be applied to the pellets.

Likewise, the resultant pellets were further subjected to the sintering, the grinding, the provision of the electrodes, the polarization, and the examination of the electrically induced strains in the same manner as the First Preferred Embodiment. The thus prepared pellets could be classified into the following three types: a Second Preferred Embodiment in which the sphere-shaped Pt particles were dispersed; a Third Preferred Embodiment in which the plate-shaped Pt particles were dispersed without being oriented; a Fourth Preferred Embodiment in which the plate-shaped Pt particles were dispersed and oriented.

Figure 3:
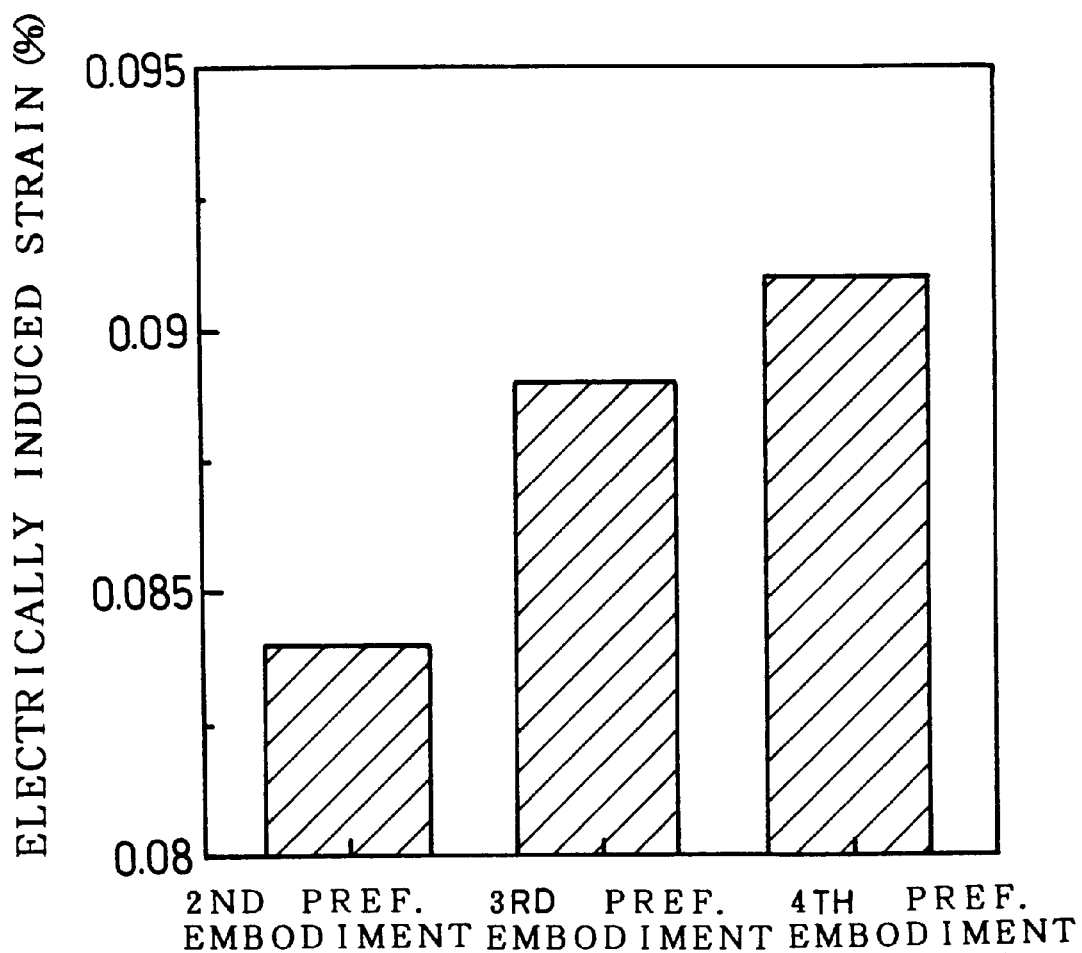
FIG. 3 is a bar chart for comparing the electrically induced strains exhibited by piezoelectric materials of Second, Third and Fourth Preferred Embodiments according to the present invention with each other.

FIG. 3 illustrates the electrically induced strains which were exhibited by the Second, Third and Fourth Preferred Embodiments. The electrically induced strains of the Third and Fourth Preferred Embodiments were larger than that of the Second Preferred Embodiment. It is thus apparent that the dispersion effect of the particles of the noble metal component was enhanced by dispersing the plate-shaped Pt particles. Moreover, the electrically induced strain of the Fourth Preferred Embodiment, in which the plate-shaped Pt particles were oriented, was further larger than that of the Third Preferred Embodiment, in which the plate-shaped Pt particles were not oriented. It is obvious therefore that the dispersion effect of the particles of the noble metal component was furthermore upgraded by orienting the plate-shaped particles of the noble metal component.

Fifth Preferred Embodiment

An aqueous solution of platinum dinitro diamine was mixed with the same raw PZT ceramic powder as prepared in the First Preferred Embodiment in a wet manner. The content of the platinum dinitro diamine aqueous solution was controlled so that the metallic Pt particles could deposit on the raw PZT ceramic powder in an amount of 0.45 vol. %.

The resulting mixture was mixed in a wet manner continuously for a sufficient period of time to prepare a slurry. Then, the slurry was fully dried. Thereafter, the resultant dried substance was smashed finely to prepare a piezoelectric ceramic powder. When the thus prepared piezoelectric ceramic powder was observed by using an electron microscope, the Pt elements were found to be deposited as particles on the surface of the raw PZT ceramic particles, and the deposited Pt particles were assumed to have an average particle diameter of 10 nm or less.

The thus prepared piezoelectric ceramic powder was put in a crucible, and was subjected to a heat treatment. The crucible was formed of MgO. The heat treatment was carried out at a temperature of 700° C. in an oven. The atmosphere in the oven was identical with the air. When the heat treatment was carried out for 4 hours continuously, the deposited Pt particles grew granularly.

The thus thermally-treated piezoelectric ceramic powder was processed to a piezoelectric ceramic in the same manner as the First Preferred Embodiment. The piezoelectric ceramic with the granularly-grown Pt particles added was thus completed.

Figure 4:
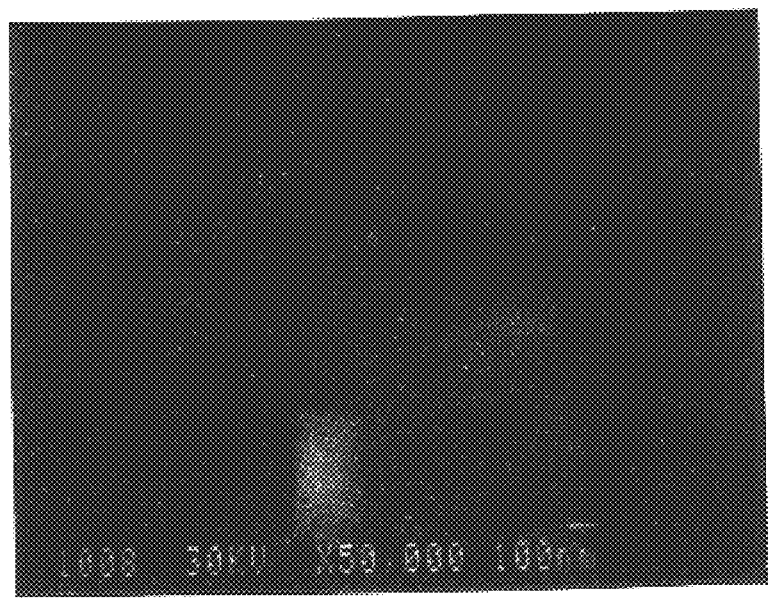
FIG. 4 is a backscattered electron image of a piezoelectric material prepared in a Fifth Preferred Embodiment according to the present invention by using SEM (scanning electron microscope)

FIG. 4 shows the backscattered electron image of the resultant piezoelectric ceramic specimen by using SEM (scanning electron microscope). Note that, in FIG. 4, the dark portions specify the raw PZT ceramic particle, and the light portions specify the Pt particles. As can be seen from FIG. 4, in the piezoelectric ceramic specimen prepared in the Fourth Preferred Embodiment, the Pt particles having an average particle diameter of 100 nm or more were dispersed in the raw PZT ceramic.

Sixth Preferred Embodiment

Except that the piezoelectric ceramic powder was subjected to the heat treatments which were carried out at a temperature of 400, 500 and 600° C., respectively, the piezoelectric ceramic specimens of the Sixth Preferred Embodiment were prepared in the same manner as the Fifth Preferred Embodiment.

Seventh Preferred Embodiment

Except that the piezoelectric ceramic powder was not subjected to the heat treatment, the piezoelectric ceramic specimen of the Seventh Preferred Embodiment was prepared in the same manner as the Fifth Preferred Embodiment. In other words, the piezoelectric ceramic specimen of the Seventh Preferred Embodiment was prepared without granularly growing the Pt particles.

Evaluation on Piezoelectric Constants and Electrically Induced Strains of

Fifth, Sixth and Seventh Preferred Embodiments

Each of the disk-shaped piezoelectric ceramic specimens prepared in the Fifth, Sixth and Seventh Preferred Embodiments was subjected to the grinding, the provision of the electrodes, and the polarization in the same manner as the First Preferred Embodiment.

Figure 5:
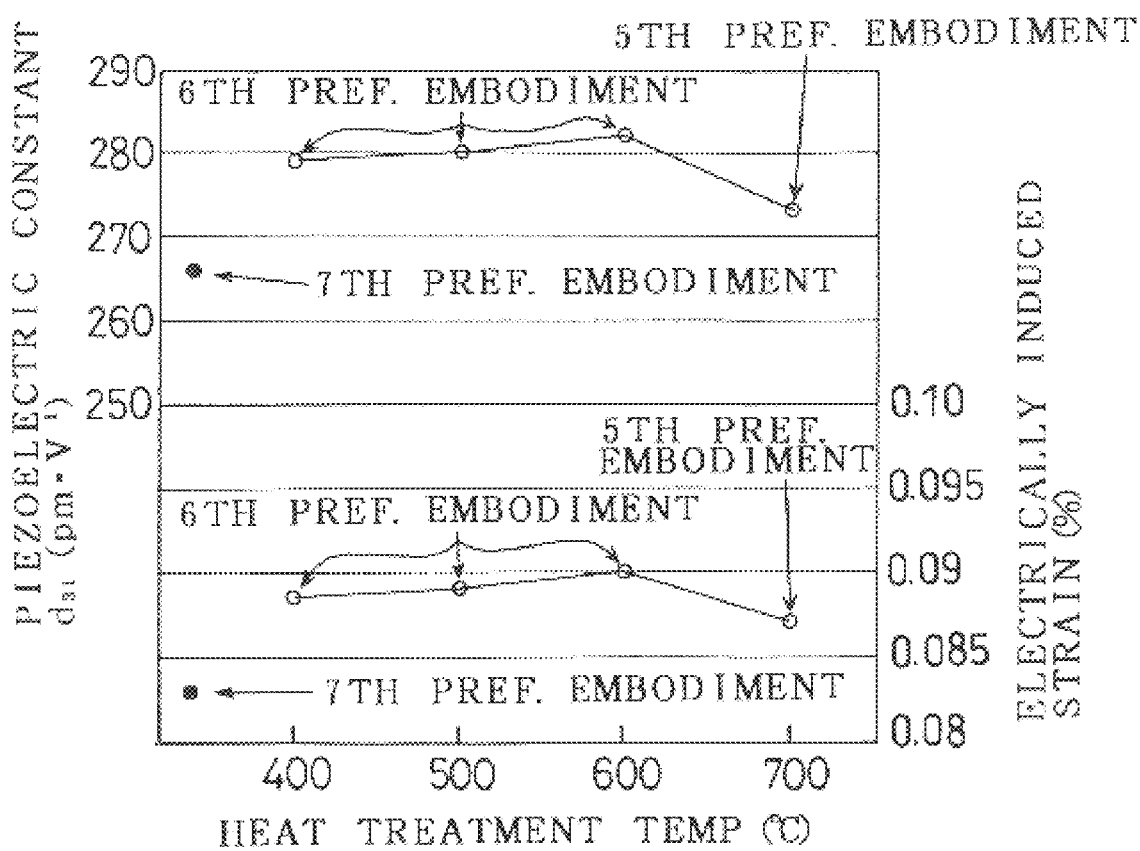
FIG. 5 is a line chart for comparing the piezoelectric constants ($d_{31}$) and strains exhibited by piezoelectric materials, which were prepared in Fifth, Sixth and Seventh Preferred Embodiments according to the present invention, with each other.

Each of the polarized disk-shaped piezoelectric ceramic specimens was examined for the piezoelectric constant ($d_{31}$) in the radial direction by an impedance analyzer. The impedance analyzer was "HP4194A" manufactured by Hewlett Packard Co., Ltd. Moreover, each of the disk-shaped piezoelectric ceramic specimens was examined for the electrically induced strain in the same fashion as the First Preferred Embodiment. FIG. 5 illustrates the thus measured piezoelectric constants ($d_{31}$) and electrically induced strains exhibited by the polarized disk-shaped piezoelectric ceramic specimens of the Fifth, Sixth and Seventh Preferred Embodiments.

As can be appreciated from FIG. 5, the piezoelectric constant ($d_{31}$) and electrically induced strain exhibited by the disk-shaped piezoelectric ceramic specimen of the Fifth Preferred Embodiment was remarkably larger than those exhibited by the disk-shaped piezoelectric ceramic specimen of the Seventh Preferred Embodiment. In addition, the piezoelectric constant ($d_{31}$) and electrically induced strain exhibited by the disk-shaped piezoelectric ceramic specimens of the Sixth Preferred Embodiment were found to be much larger than those exhibited by the disk-shaped piezoelectric ceramic specimen of the Fifth Preferred Embodiment.

Eighth Preferred Embodiment

Figure 7:
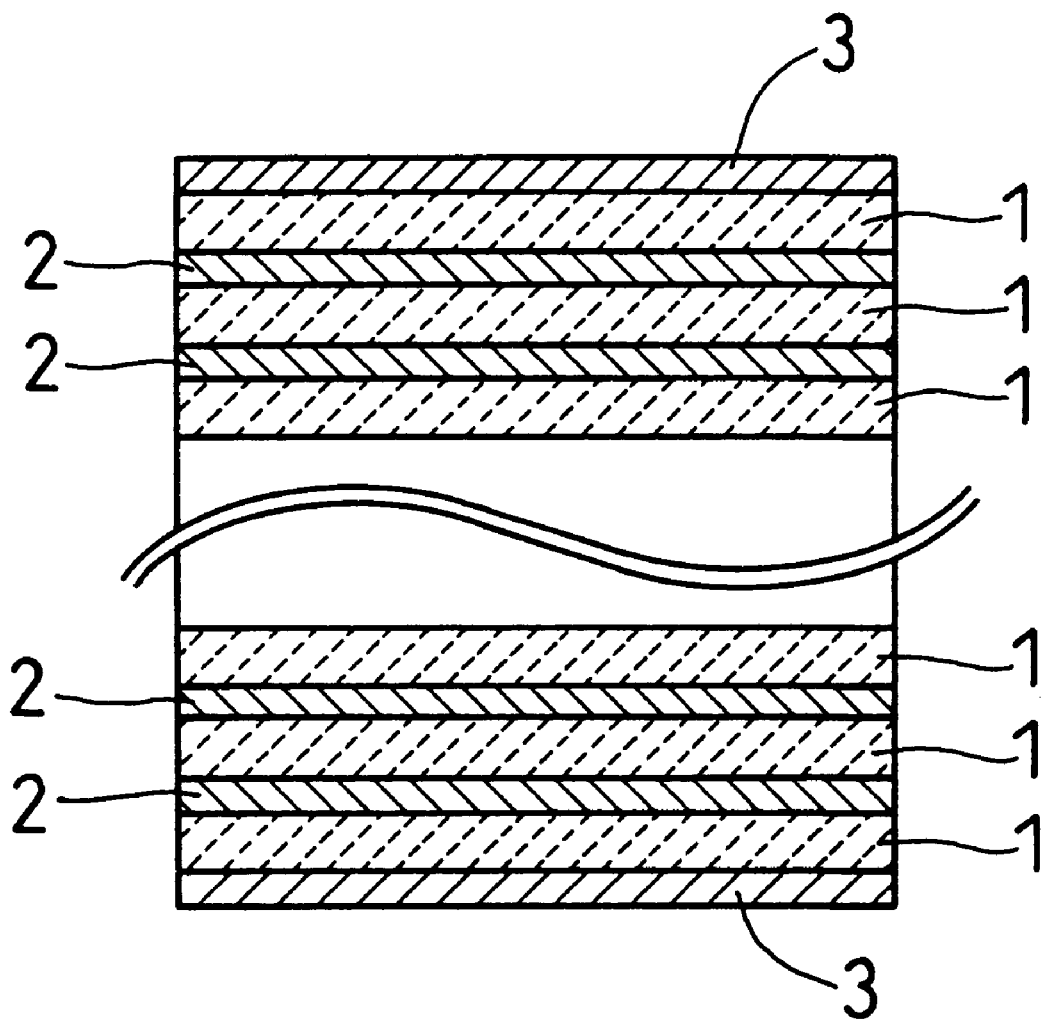
FIG. 7 is a schematic cross-sectional view of a piezoelectric elements prepared in the Eighth and Ninth Preferred Embodiments and Comparative Example No. 1.

The present invention will be hereinafter described with reference to the application to a piezoelectric element. A sample piezoelectric element was prepared as hereinafter described, and included a plurality of piezoelectric layers 1 and conductive layers 2 as schematically illustrated in FIG. 7. The piezoelectric layers 1 were formed of a PZT ceramic. The conductive layers 2 were formed of Pt. (Preparation of PZT Ceramic Green Sheet)

5 weight % of a binder, a trace amount of a plasticizer, and a trace amount of a defoaming agent were added to 95 weight % of a commercial available PZT ceramic powder. The PZT ceramic powder was, for example, "PE510" produced by Fuji Titan Co., Ltd. The binder was formed of a polyvinyl butyral (PVB). The resulting mixture was put into an organic solvent to produce a slurry in which the components were dispersed. The organic solvent was toluene. The slurry was molded by a doctor-blade method to prepare a PZT ceramic green sheet having a thickness of about 50 $\mu$m. (Preparation of Conductive Layers)

Then, Pt was vapor-deposited on the thus prepared PZT ceramic green sheet by an ion coater in a thickness of about 0.2 $\mu$m. The PZT ceramic green sheet provided with the vapor-deposited Pt was cut to a size of 40 mm×40 mm. Twenty pieces of the cut PZT ceramic green sheet were laminated. The laminated substance was then integrated by a hot press to prepare internal electrodes formed of Pt. Moreover, the integrated substance was baked, and was thereafter held at 1,200° C. for 2 hours to carry out sintering. Finally, the sintered substance was cut and finished to a plate-shaped piezoelectric element precursor having a size of 15 mm×15 mm×0.8 mm.
(Preparation of External Electrodes)

As schematically illustrated in FIG. 7, the top and bottom surfaces of the resultant plate-shaped piezoelectric element precursor were provided with an external electrode 3 by ion-coating Pt, respectively. Moreover, the plate-shaped piezoelectric element precursor provided with the external electrodes was polarized in a silicone oil by applying an electric field. In the polarization, the temperature of the silicone oil was controlled at 100° C., and the electric field having a magnitude of 3 kV/mm was applied to the plate-shaped piezoelectric element precursor for 10 minutes. A piezoelectric element of the Eighth Preferred Embodiment was thus completed as schematically illustrated in FIG. 7. The thus prepared piezoelectric element included internal conductive layers 2 whose thickness was about 0.2 $\mu$m, and piezoelectric layers 1 whose thickness was about 40 $\mu$m.

Ninth Preferred Embodiment
(Preparation of PZT Ceramic Green Sheet)

A PZT ceramic green sheet was prepared in the same manner as the Eighth Preferred Embodiment.
(Preparation of Conductive Layers)

Then, a Pt paste was printed on the PZT ceramic green sheet by a screen printing process. The Pt paste was turned into the internal electrode as hereinafter described. Note that the Pt paste included Pt particles having an average particle diameter of about 0.2 $\mu$m, and the viscosity of the Pt paste was controlled so as to keep the printed thickness at about 0.5 $\mu$m. Thereafter, the preparation set forth in the Eighth Preferred Embodiment was followed similarly: the PZT ceramic green sheet provided with the printed Pt paste was cut to a size of 40 mm×40 mm. Twenty pieces of the cut PZT ceramic green sheet were laminated. The laminated substance was then integrated by a hot press to prepare internal electrodes formed of Pt. Moreover, the integrated substance was baked, and was thereafter held at 1,200° C. for 2 hours to carry out sintering. Finally, the sintered substance was cut and finished to a plate-shaped piezoelectric element precursor having a size of 15 mm×15 mm×0.8 mm.
(Preparation of External Electrodes)

As schematically illustrated in FIG. 7, the top and bottom surfaces of the resultant plate-shaped piezoelectric element precursor were provided with an external electrode 3 by ion-coating Pt, respectively. Moreover, the plate-shaped piezoelectric element precursor provided with the external electrodes was polarized in a silicone oil by applying an electric field. In the polarization, the temperature of the silicone oil was controlled at 100° C., and the electric field having a magnitude of 3 kV/mm was applied to the plate-shaped piezoelectric element precursor for 10 minutes. A piezoelectric element of the Ninth Preferred Embodiment was thus completed as schematically illustrated in FIG. 7. The thus prepared piezoelectric element included internal conductive layers 2 whose thickness was about 0.5 $\mu$m, and piezoelectric layers 1 whose thickness was about 40 $\mu$m.

Comparative Example No. 1
(Preparation of PZT Ceramic Green Sheet)

A PZT ceramic green sheet was prepared in the same manner as the Eighth Preferred Embodiment.
(Preparation of Conductive Layers)

Then, a Pt paste was printed on the PZT ceramic green sheet by a screen printing process. The Pt paste was turned into the internal electrode as hereinafter described. Note that the Pt paste included coarse Pt particles having an average particle diameter of about 1 $\mu$m, and the viscosity of the Pt paste was controlled so as to keep the printed thickness at about 3 $\mu$m. Thereafter, the preparation set forth in the Eighth Preferred Embodiment was followed similarly: the PZT ceramic green sheet provided with the printed Pt paste was cut to a size of 40 mm×40 mm. Twenty pieces of the cut PZT ceramic green sheet were laminated. The laminated substance was then integrated by a hot press to prepare internal electrodes formed of Pt. Moreover, the integrated substance was baked, and was thereafter held at 1,200° C. for 2 hours to carry out sintering. Finally, the sintered substance was cut and finished to a plate-shaped piezoelectric element precursor having a size of 15 mm×15 mm×0.8 mm.
(Preparation of External Electrodes)

As schematically illustrated in FIG. 7, the top and bottom surfaces of the resultant plate-shaped piezoelectric element precursor were provided with an external electrode 3 by ion-coating Pt, respectively. Moreover, the plate-shaped piezoelectric element precursor provided with the external electrodes was polarized in a silicone oil by applying an electric field. In the polarization, the temperature of the silicone oil was controlled at 100° C., and the electric field having a magnitude of 3 kV/mm was applied to the plate-shaped piezoelectric element precursor for 10 minutes. A piezoelectric element of Comparative Example No. 1 was thus completed as schematically illustrated in FIG. 7. The thus prepared piezoelectric element included internal conductive layers 2 whose thickness was about 3 $\mu$m, and piezoelectric layers 1 whose thickness was about 40 $\mu$m.

Comparative Example No. 2

A piezoelectric element of Comparative Example No. 2 was a piezoelectric element in which no internal conductive layer was present.
(Preparation of PZT Ceramic Green Sheet)

A PZT ceramic green sheet was prepared in the same manner as the Eighth Preferred Embodiment, and was prepared in the following manner: the PZT ceramic green sheet was cut to a size of 40 mm×40 mm. Twenty pieces of the cut PZT ceramic green sheet were laminated. Then, the laminated substance was integrated by a hot press. Further, the resultant integrated substance was baked, and was thereafter held at 1,200° C. for 2 hours to carry out sintering. Furthermore, the sintered substance was cut and finished to a plate-shaped piezoelectric element precursor having a size of 15 mm×15 mm×0.8 mm.
(Preparation of External Electrodes)

The top and bottom surfaces of the resultant plate-shaped piezoelectric element precursor were provided with an external electrode by ion-coating Pt, respectively. Finally, the plate-shaped piezoelectric element precursor provided with the external electrodes was polarized in a silicone oil by applying an electric field. In the polarization, the temperature of the silicone oil was controlled at 100° C., and the electric field having a magnitude of 3 kV/mm was applied to the plate-shaped piezoelectric element precursor or 10 minutes. A piezoelectric element of Comparative Example No. 2 was thus completed. The thus prepared piezoelectric element was free from a conductive layer, but included a single piezoelectric body whose thickness was about 0.8 mm.

Evaluation on Displacement Abilities of

Eight and Ninth Preferred Embodiments and Comparative Example Nos. 1 and 2

Figure 6:
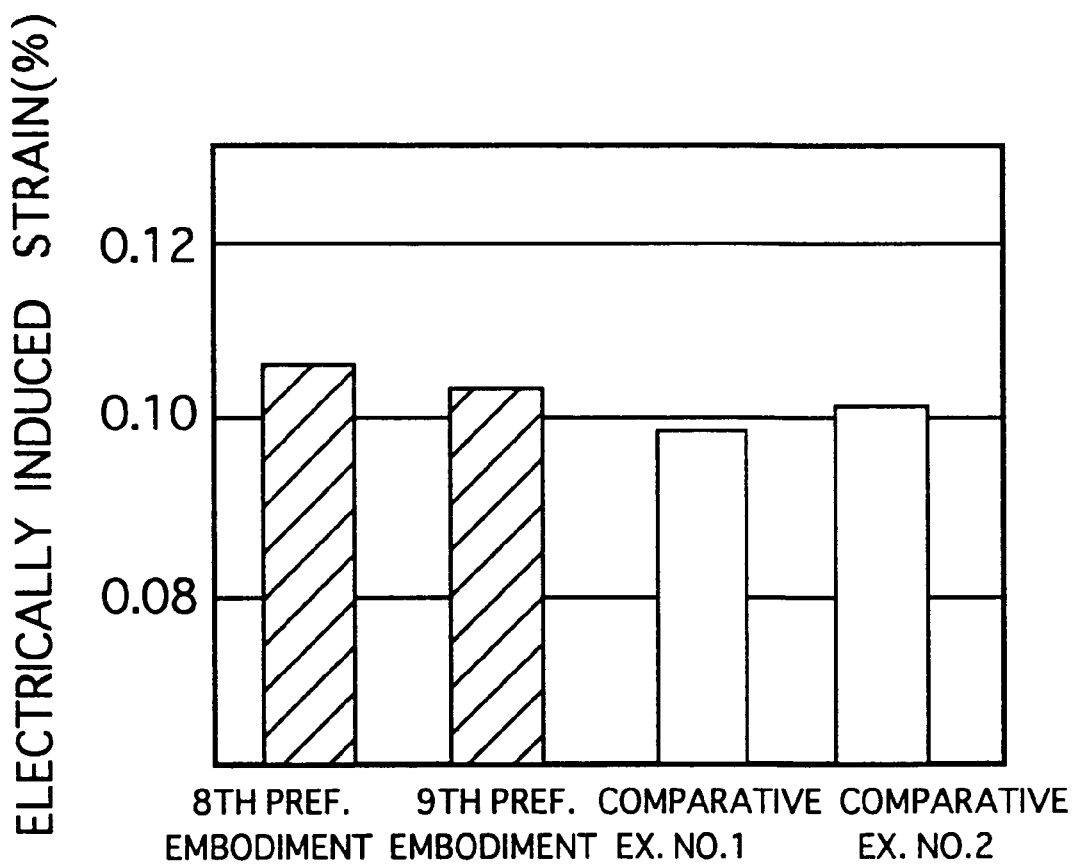
FIG. 6 is a bar chart for comparing the strains exhibited by piezoelectric elements of Eighth and Ninth Preferred Embodiments according to the present invention with the strains exhibited by piezoelectric elements of Comparative Example Nos. 1 and 2.

The piezoelectric elements prepared in the Eighth and Ninth Preferred Embodiments, and the piezoelectric elements prepared in Comparative Example Nos. 1 and 2 were examined for the displacement ability by the micro-displacement-measuring apparatus developed at the assignee of the present invention. The measurements of the displacement ability were carried out at ordinary temperature in air while subjecting the piezoelectric elements to a compressive stress of 20 MPa, and applying a 0.1 Hz alternating voltage of from 0 to 1 kV thereto. FIG. 6 illustrates the results of the measurements. When the Eighth and Ninth Preferred Embodiments were compared with Comparative Example No. 2, the piezoelectric elements of the Eighth and Ninth Preferred Embodiments exhibited an electrically induced strain larger than an electrically induced strain exhibited by the piezoelectric element of Comparative Example No. 2. The piezoelectric element of Comparative Example No. 2 did not relieve the internal strains, and did not produce the electrically induced strain as large as those produced by the piezoelectric elements of the Eighth and Ninth Preferred Embodiments, because no conductive layer was present in the piezoelectric element of Comparative Example No. 2. In addition, the piezoelectric element of Comparative Example No. 1 produced the electrically induced strain much smaller than the electrically induced stain produced by the piezoelectric element of Comparative Example No. 2.

The disadvantage associated with the piezoelectric element of Comparative Example No. 1 resulted from the arrangement that the conductive layers had a heavy thickness of about 3 $\mu$m. Specifically, the piezoelectric element of Comparative Example No. 1 exhibited the reduced electrically induced strain, because the thick conductive layers not only absorbed the internal strains but also the inherent strains to be exhibited by the piezoelectric layers.

Having now fully described the present invention, it will be apparent to one of ordinary skill in the art that many changes and modifications can be made thereto without departing from the spirit or scope of the present invention as set forth herein including the appended claims.

What is claimed is:

1. A piezoelectric material, comprising:

a lead zirconate titanate (PZT) ceramic; and a noble metal component in an amount of 0.35 parts by volume or more to 100 parts by volume of said PZT ceramic, the noble metal component being at least one element selected from the group consisting of ruthenium (Ru), rhodium (Rh), palladium (Pd), osmium (Os), iridium (Ir), platinum (Pt) and gold (Au), or being an alloy of silver (Ag) and the noble metal element.

2. The piezoelectric material according to claim 1, wherein said noble metal component is in the form of powder is dispersed in said PZT ceramic.

3. The piezoelectric material according to claim 2, wherein said noble metal component in the form of a plate-shaped particle having a pair of planes and a thickness therebetween is dispersed in grain boundaries of said PZT ceramic.

4. The piezoelectric material according to claim 3, wherein the planes are oriented perpendicular with respect to a direction of an electric field to be applied to the piezoelectric material.

5. The piezoelectric material according to claim 3, wherein the thickness is 1/10 or less of a lengthwise dimension of the planes.

6. The piezoelectric material according to claim 1, wherein said PZT ceramic is of a particle having an average particle diameter, and said noble metal component is of a particle having an average particle diameter 1/10 or less as long as that of the PZT ceramic.

7. The piezoelectric material according to claim 1, wherein said noble metal component is deposited on a surface of the PZT ceramic in the form of powder thereafter being grown to granular form by heating the resulting PZT ceramic with the deposit.

8. The piezoelectric material according to claim 7, wherein said granular noble metal component has an average particle diameter of 100 $\mu$m or less.

9. The piezoelectric material according to claim 7, wherein said PZT ceramic with said deposit is heated in a temperature range of from 400 to 600° C.

* * * * *

UNITED STATES PATENT AND TRADEMARK OFFICE
CERTIFICATE OF CORRECTION

PATENT NO. : 5,935,485

DATED : August 10, 1999

INVENTOR(S): Takao TANI, et al.

It is certified that an error appears in the above-identified patent and that said Letters Patent is hereby corrected as shown below:

Column 18, line 27, "100 µm" should read --100nm--.

Signed and Sealed this

Twenty-sixth Day of September, 2000

Attest:

Q. TODD DICKINSON

*Attesting Officer*  *Director of Patents and Trademarks*